(12) United States Patent
Mauder et al.

(10) Patent No.: US 12,211,945 B2
(45) Date of Patent: Jan. 28, 2025

(54) POWER DIODE AND METHOD OF MANUFACTURING A POWER DIODE

(71) Applicant: Infineon Technologies Austria AG, Villach (AT)

(72) Inventors: Anton Mauder, Kolbermoor (DE); Mario Barusic, Seebogen (AT); Markus Beninger-Bina, Grosshelfendorf (DE); Matteo Dainese, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/204,721

(22) Filed: Jun. 1, 2023

(65) Prior Publication Data

US 2023/0307554 A1 Sep. 28, 2023

Related U.S. Application Data

(62) Division of application No. 17/204,698, filed on Mar. 17, 2021, now Pat. No. 11,695,083, which is a
(Continued)

(30) Foreign Application Priority Data

Aug. 18, 2017 (DE) .......................... 102017118864.9

(51) Int. Cl.
*H01L 29/861* (2006.01)
*H01L 21/265* (2006.01)
(Continued)

(52) U.S. Cl.
CPC ...... *H01L 29/861* (2013.01); *H01L 21/26513* (2013.01); *H01L 21/2658* (2013.01);
(Continued)

(58) Field of Classification Search
CPC .............................. H01L 29/861; H01L 29/36
See application file for complete search history.

(56) References Cited

U.S. PATENT DOCUMENTS 5,286,660 A 2/1994 Chiou et al.
5,759,904 A 6/1998 Dearnaley
(Continued)

FOREIGN PATENT DOCUMENTS

CN 102054876 A 5/2011
CN 104904020 A 9/2015
(Continued)

OTHER PUBLICATIONS

Wilson, R.G., "Boron, fluorine, and carrier profiles for B and BF2 implants into crystalline and amorphous Si", Journal of Applied Physics, vol. 54, No. 12, Dec. 1983, pp. 6879-6889.

*Primary Examiner* — Michele Fan
(74) *Attorney, Agent, or Firm* — Murphy, Bilak & Homiller, PLLC

(57) ABSTRACT

A power diode includes a semiconductor body having an anode region and a drift region, the semiconductor body being coupled to an anode metallization of the power diode and to a cathode metallization of the power diode, and an anode contact zone and an anode damage zone, both implemented in the anode region, the anode contact zone being arranged in contact with the anode metallization, and the anode damage zone being arranged in contact with and below the anode contact zone, wherein fluorine is included within each of the anode contact zone and the anode damage zone at a fluorine concentration of at least 1016 atoms*cm-3.

13 Claims, 4 Drawing Sheets

Related U.S. Application Data division of application No. 16/104,799, filed on Aug. 17, 2018, now Pat. No. 10,978,596.

(51) Int. Cl.
  *H01L 29/06* (2006.01)
  *H01L 29/32* (2006.01)
  *H01L 29/66* (2006.01)

(52) U.S. Cl.
  CPC .......... *H01L 29/0688* (2013.01); *H01L 29/32* (2013.01); *H01L 29/6609* (2013.01); *H01L 29/66136* (2013.01)

(56) References Cited

U.S. PATENT DOCUMENTS

| | | |
|---|---|---|
| 6,096,627 A | 8/2000 | Harris et al. |
| 10,141,304 B2 | 11/2018 | Iwasaki et al. |
| 2007/0281433 A1* | 12/2007 | Mollat .............. H01L 21/26513 438/380 |
| 2010/0032794 A1 | 2/2010 | Pendharkar et al. |
| 2011/0108941 A1 | 5/2011 | Vobecky et al. |
| 2012/0248576 A1 | 10/2012 | Schmidt et al. |
| 2013/0221449 A1 | 8/2013 | Aoyama |
| 2015/0303268 A1 | 10/2015 | Ishimaru et al. |
| 2017/0317075 A1 | 11/2017 | Arai et al. |
| 2019/0081167 A1* | 3/2019 | Chen ................. H01L 29/42372 |

FOREIGN PATENT DOCUMENTS

| | | | |
|---|---|---|---|
| CN | 105609547 A | | 5/2016 |
| EP | 3196943 A1 | | 7/2017 |
| JP | 2003224281 A | | 8/2003 |
| JP | 2008172055 A | * | 7/2008 |
| JP | 2009283808 A | | 12/2009 |

\* cited by examiner

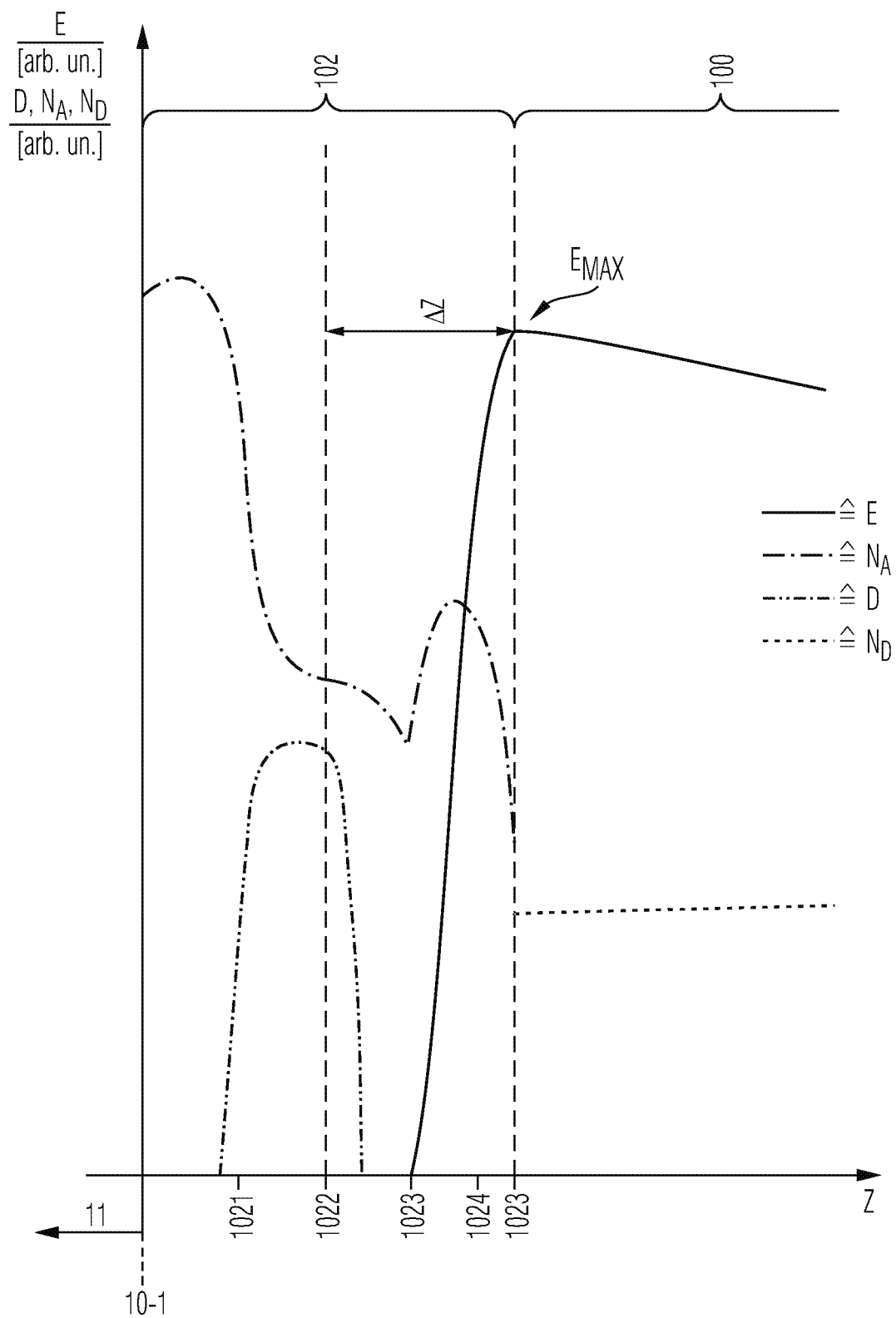

POWER DIODE AND METHOD OF MANUFACTURING A POWER DIODE

RELATED APPLICATIONS

The instant application is a divisional of and claims priority to U.S. application Ser. No. 17/204,698 filed on Mar. 17, 2021, which in turn claims priority from U.S. application Ser. No. 16/104,799 filed on Aug. 17, 2018, which in turn claims priority from German Application 102017118864.9 filed on Aug. 18, 2017 and incorporated by reference herein in its entirety.

TECHNICAL FIELD

This specification refers to embodiments of a power diode and to embodiments of a method of processing a power diode. In particular, this specification is directed to embodiments of a power diode with a specific semiconductor anode structure and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and power diodes, to name a few, have been used for various applications including, but not limited to switches in power supplies and power converters.

A power diode usually comprises a semiconductor body configured to conduct a load current along a load current path between two load terminals of the diode, if a voltage in a forward direction is applied between said terminals. If a voltage in a backward direction is applied, the power diode usually assumes a blocking state and flow of a load current is inhibited.

The load terminals of a power diode are usually referred to as anode terminal and cathode terminal, and a transition from a conducting state to a blocking state of the power diode may follow a reverse recovery behavior of the power diode.

If employed in a certain application, it may be desirable that a too high charge carrier concentration in proximity to the anode terminal is avoided such that high current peaks during the reverse recovery may be avoided.

SUMMARY

According to an embodiment, a method of processing a power diode comprises: providing a semiconductor body; creating an anode region and a drift region in the semiconductor body; forming, by a single ion implantation processing step, each of an anode contact zone and an anode damage zone in the anode region.

According to another embodiment, a power diode comprises: a semiconductor body with an anode region and a drift region, the semiconductor body being coupled to an anode metallization of the power diode and to a cathode metallization of the power diode; an anode contact zone and an anode damage zone, both implemented in the anode region, the anode contact zone being arranged in contact with the anode metallization, and the anode damage zone being arranged in contact with and below the anode contact zone; wherein the anode damage zone extends into the anode region along a vertical direction no further than down to an extension level of 75 nm, measured from a transition between the anode metallization and the anode contact zone.

According to a further embodiment, a power diode comprises: a semiconductor body with an anode region and a drift region, the semiconductor body being coupled to an anode metallization of the power diode and to a cathode metallization of the power diode; an anode contact zone and an anode damage zone, both implemented in the anode region, the anode contact zone being arranged in contact with the anode metallization, and the anode damage zone being arranged in contact with and below the anode contact zone; wherein fluorine is included within each of the anode contact zone and the anode damage zone at a fluorine concentration of at least $10^{16}$ atoms*cm$^{-3}$.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 4 schematically and exemplarily illustrates a section of the diagram of FIG. 3 in an enlarged view.

DETAILED DESCRIPTION

Figure 1:
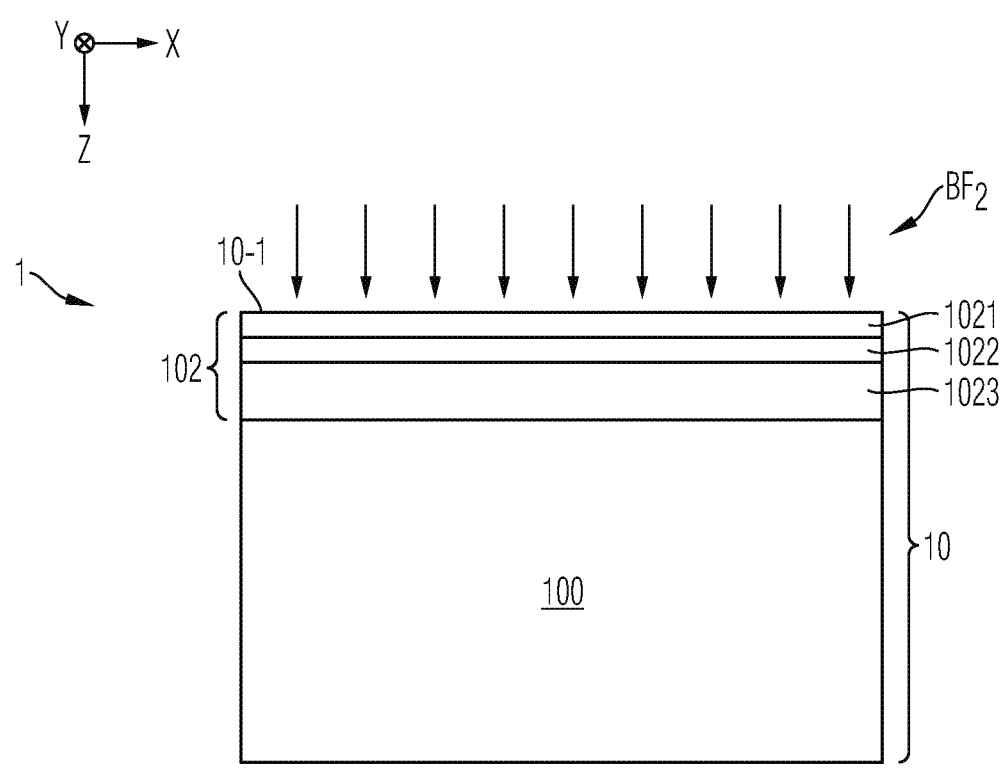
FIG. 1 schematically and exemplarily illustrates an aspect of a method of processing a power diode in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cells and/or such transistor cells may be integrated in a power semiconductor module. A plurality of such cells may constitute a cell field that is arranged with an active region of the power semiconductor device.

The present specification further relates to a power semiconductor device in the form of a power diode.

The term "power diode" as used in this specification intends to describe a semiconductor device on a single chip with high voltage blocking and/or high current-carrying capabilities. In other words, such power diode is intended for high current, typically in the Ampere range, e.g., up to several ten or hundred Ampere, and/or high voltages, typically above 15 V, more typically 100 V and above, e.g., up to at least 400 V.

For example, the power diode described below may be a semiconductor device configured to be employed as a power component in a low-, medium- and/or high voltage application. For example, the term "power diode" as used in this specification is not directed to logic semiconductor devices that are used for, e.g., storing data, computing data and/or other types of semiconductor based data processing.

FIG. 1 schematically and exemplarily illustrates an aspect of a method of processing a power diode 1. The method may comprise providing a semiconductor body 10 and creating each of an anode region 102 and a drift region 100 in the semiconductor body 10. Creating the drift region 100 may occur separately from creating the anode region 102.

The drift region 100 may comprise dopants of the first conductivity type. For example, the drift region 100 is n-doped. The drift region 100 may exhibit a dopant concentration of dopants of the first conductivity type within the range of $10^{12}$ cm$^{-3}$ to $5*10^{14}$ cm$^{-3}$. For example, the dopant concentration of the drift region 100 and its total extension along the vertical direction Z are chosen in dependence on the voltage rating for which the power diode shall be designed.

The anode region 102 may comprise dopants of the second conductivity type. For example, the anode region 102 is p-doped. Creating the anode region 102 may comprise at least one of an implantation processing step and a diffusion processing step. For example, by means of creating the anode region 102, a base dopant concentration can be achieved in the anode region 102, wherein the base dopant concentration may have a profile with a doping concentration that decreases in the vertical direction Z, e.g., a diffusion profile. Alternatively, the anode region 102 may have a base dopant concentration which is substantially homogenously distributed within the anode region 102.

Embodiments described herein relate to modifying the anode region 102 in terms of locally adjusting the dopant concentration and/or a defect concentration within the anode region 102 that may initially exhibit said base dopant concentration.

For example, the method of processing the power diode 1 may include forming, by a single ion implantation processing step, each of an anode contact zone 1021 and an anode damage zone 1022 in the anode region 102.

Within the scope of the present specification, the term "single ion implantation processing step" may designate an uninterrupted implantation processing step that is carried out with non-variation of the implantation energy, with non-variation of the implantation dose and with non-variation of the implantation ions. For example, in order to carry out said single ion implantation processing step, an ion implantation device is controlled by means of setting control parameters, e.g., a fixed implantation energy range, a fixed implantation dose range, a fixed implantation duration, and a fixed ambient temperature range. Said single ion implantation processing step in this context may also be understood as the sequence of two or more uninterrupted implantation shots that are carried out each with non-variation of the implantation energy, with non-variation of the implantation dose and with non-variation of the implantation ions.

For example, the ion implantation device used for carrying out the single ion implantation processing step is a beamline-implantation-device. For example, a beamline implantation tool is provided that separates the isotopes or species (e.g. ionized atoms or molecules) to be implanted. For example, the isotopes or species are focused in a beam and post-accelerated to the desired energy before they hit the semiconductor body. The beamline-implantation-device may implant monoenergetic species of the same relation mass to charge by either scanning the semiconductor wafer by deflection of the beam or moving the semiconductor wafer under the fixed beam.

For example, the single ion implantation processing step comprises implanting heavy ions. The heavy ions may comprise ions with a mass exceeding that of the $_6{}^{12}$carbon-nucleus or the $_{14}{}^{28}$silicium-nucleus.

In an embodiment, the single ion implantation processing step comprises implanting ionized boron difluoride ($BF_2$) molecules. The single ion implantation processing step can be realized by a pure $BF_2$ ion implantation.

For example, the single ion implantation processing step is carried with an implantation energy of less than 30 keV or less than 20 keV. For example, the single ion implantation processing step is carried such that the a mean distance of the implanted ions, measured from a surface 10-1 of the provided semiconductor body 10 that has been penetrated by the implanted ions, amounts to less than 100 nm. This mean distance can be even shorter, e.g., shorter than 80 nm, shorter than 70 nm or even shorter than 50 nm. A possible measure to adjust the mean distance is not only the implantation energy applied during the single ion implantation processing step, but also a thickness of thin oxide layer (not illustrated) at the surface 10-1 that may come into being during preparation of the single ion implantation processing step.

Further, the single ion implantation processing step can be carried out with an implantation dose of at least $2*10^{13}$ cm$^{-2}$. The implantation dose can be greater than $2*10^{13}$ cm$^{-2}$, e.g., greater than $3*10^{13}$ cm$^{-2}$, or even greater than $6*10^{13}$ cm$^{-2}$.

In an embodiment of the method, the single ion implantation processing step is followed by a temperature annealing processing step that is carried out at a temperature smaller than 450° C., wherein defects caused by the implanted ions are only partially annealed. The temperature can be kept smaller than 450° C., e.g., smaller than 420° C. or smaller than 400° C. The duration of the temperature annealing processing step may dependent on several factors and may be within the range of some minutes to some hours.

For example, due to such low-temperature annealing processing step, it can be ensured that predominantly defects in proximity to the surface 10-1 are partially annealed, thereby forming the anode contact zone 1021 with a comparatively lower defect concentration and a comparatively higher dopant concentration. For example, the anode contact zone 1021 may exhibit a high dopant concentration of dopants of the second conductivity type and/or alternatively a high interstitial density, e.g., within the range of $10^{18}$ cm$^{-3}$ to $10^{20}$ cm$^{-3}$.

For example, due to such low-temperature temperature annealing processing step, it can further be ensured that predominantly defects spatially displaced from the surface 10-1 are not annealed, thereby forming the anode damage zone 1022 with a comparatively high defect concentration and a comparatively low dopant concentration. For example, the anode damage zone 1022 may exhibit a high defect concentration, e.g., within the range of $10^{18}$ cm$^{-3}$ to $10^{20}$ cm$^{-3}$.

In an embodiment, the created anode damage zone 1022 can be configured to reduce at least one of a lifetime and a mobility of charge carriers present within the anode damage zone 1022. For example, the damage zone 1022 can be configured to reduce the emitter efficiency of the anode region 102.

Figure 2:
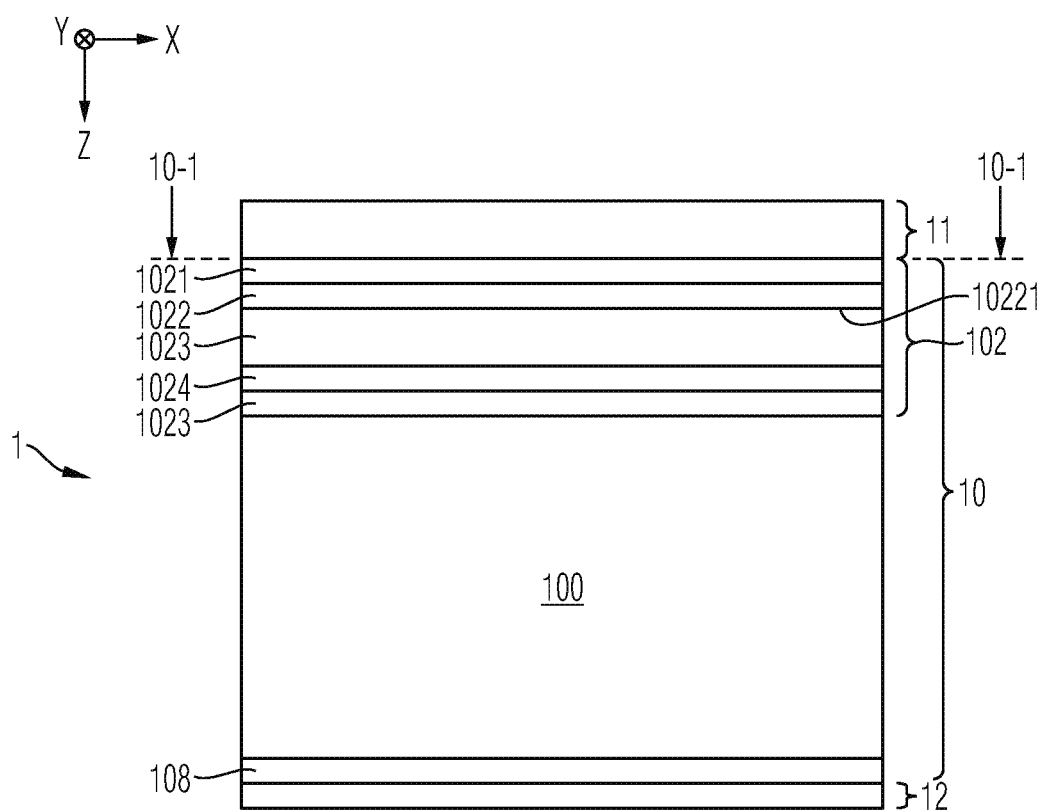
FIG. 2 schematically and exemplarily illustrates a section of a vertical cross-section of a power diode in accordance with one or more embodiments.

Now it is additionally referred to FIG. 2, which schematically and exemplarily illustrates a section of a vertical cross-section of a power diode 1 in accordance with one or more embodiments. The power diode 1 may have been produced in accordance with the method described above. Thus, what has been stated with respect to FIG. 1 may equally apply to the embodiment of FIG. 2. Analogously, what will now be stated with respect to FIG. 2 may equally apply to the embodiment of FIG. 1.

In an embodiment of the method, before carrying out the single ion implantation processing step, a first implantation processing step is carried out for forming an anode field stop zone 1024 within the anode region 102, the anode field stop zone 1024 being arranged deeper within the anode region 102 than each of the anode contact zone 1021 and the anode damage zone 1022. The anode field stop zone 1024 can be spatially separated from the anode damage zone 1022, e.g., by means of an anode body zone 1023, as will be explained in more detail below.

For example, at first the anode region 102 is created by means of providing said base dopant concentration, e.g., by at least one of an implantation processing step and a diffusion processing step. For example, the base dopant concentration of the anode region 102 can be achieved with boron as the dopant material. In the illustrated embodiments, the region referred to with reference numeral 1023 may designate an anode body zone that may essentially exhibit said base dopant concentration.

Thereafter, the anode field stop zone 1024 may be formed by carrying out the first implantation processing step that is different from the single ion implantation processing step. The anode field stop zone 1024 may be arranged in a lower part of the anode region 102 or may even terminate the anode region 1024. Further, implantation particles introduced in the anode region 102 by means of the first implantation processing step can be subjected to a temperature annealing processing step so as to anneal defects caused by said implantation particles, e.g., so as to completely anneal the defects caused by said implantation particles. This may yield a comparatively high dopant concentration within the anode field stop zone 1024, e.g., a dopant concentration greater than the dopant concentration of the anode body zone(s) 1023.

The anode field stop zone 1024 may exhibit a dopant concentration of dopants of the second conductivity type within the range of 5e16 cm$^{-3}$ to 7e17 cm$^{-3}$. For example, this dopant concentration is achieved by means of implanted boron ions that are afterwards subjected to the temperature annealing processing step.

Then, i.e., after the anode field stop zone 1024 has been created, e.g., subsequent to the first implantation processing step and the temperature annealing processing step following thereafter, the single ion implantation processing step may be carried out for forming the anode contact zone 1021 and the anode damage zone 1022.

Thus, it shall be understood, that in accordance with an embodiment, prior to the single ion implantation processing step, the dopant concentration of the anode region 102 can be adjusted, e.g., by means of implanting boron. The anode body zone(s) 1023 of the anode region 102 that do not form a part of one of the anode contact zone 1021, the anode damage zone 1022 and the anode field stop zone 1024 can exhibit a dopant concentration of dopants of the second conductivity type within the range of $1*10^{16}$ cm$^{-3}$ to $2*10^{17}$ cm$^{-3}$.

In an embodiment, the anode field stop zone 1024 is spatially displaced from the anode damage zone 1022 by at least 250 nm along the vertical direction Z. This distance can be even greater than 250 nm, e.g., greater than 400 nm or greater than 600 nm. It shall be understood that this distance between the anode field stop zone 1024 and the anode damage zone 1022 may refer to the distance between a peak of the defect concentration of the anode damage zone 1022 and a peak of the dopant concentration of the anode field stop zone 1024. The anode field stop zone 1024 and the anode damage zone 1022 may be separated from each other by means of the anode body zone 1023.

Finally, after the single ion implantation processing step, an anode metallization 11 may be provided on top of the anode region 102. For example, the anode contact zone 1021 of the anode region 102 may be arranged in contact with the anode metallization 11.

Now referring more specifically to FIG. 2, the power diode 1 comprises a semiconductor body 10 with an anode region 102 and a drift region 100, the semiconductor body 10 being coupled to an anode metallization 11 of the power diode 1 and to a cathode metallization 12 of the power diode 1. The anode metallization 11 may form a part of an anode load terminal of the power diode 1, and the cathode metallization 12 may form a part of a cathode load terminal of the power diode 1. Regarding the anode region 102 and the drift region 100 of the semiconductor body 10, the explanations already given above may apply.

Accordingly, an anode contact zone 1021 and an anode damage zone 1022 may both be implemented in the anode region 102. The anode contact zone 1021 can be arranged in contact with the anode metallization 11 and the anode damage zone 1022 can be arranged in contact with and below the anode contact zone 1021. The anode contact zone 1021 and the anode damage zone 1022 may have been produced in accordance with the method described above, e.g., by means of the single ion implantation processing step.

For example, the semiconductor body 10 further comprises a cathode contact region 108, wherein the drift region 100 can be coupled to the cathode metallization 12 by means of the cathode contact region 108. For example, the cathode contact region 108 is arranged in contact with the cathode metallization 12 and may exhibit a dopant concentration of dopants of the first conductivity type within the range of $5*10^{19}$ cm$^{-3}$ to $5*10^{20}$ cm$^{-3}$.

The power diode 1-1 may comprise, e.g., a pin or a pn-n structured that is formed by the anode region 102 ($p$), the drift region 100 ($i$ or $n^-$) and the cathode contact region 108 ($n$).

In an embodiment, the anode damage zone 1022 extends into the anode region 102 along the vertical direction Z no further than down to an extension level of 75 nm, measured from the surface 10-1 of the semiconductor body 10-1, which may be at the same level as a transition between the anode metallization 11 and the anode contact zone 1021. In addition or in alternative thereto, fluorine can be included within each of the anode contact zone 1021 and the anode damage zone 1022 at a fluorine concentration of at least $10^{16}$ atoms*cm$^{-3}$.

The extension level can be smaller than 75 nm, e.g., smaller than 50 nm or even smaller than 20 nm. In other words, in an embodiment, the a lower termination 10221 of the anode damage zone 1022 is spaced apart from the surface 10-1 of the semiconductor body 10, e.g., from the transition between the anode metallization 11 and the anode region 102 by no more than 75 nm, no more than 50 nm or no more than 20 nm. In other words, the anode damage zone 1022 may be arranged below the anode contact zone 1021, yet be positioned very close to the anode metallization 11 and sufficiently far away from the pn-junction formed between the anode region 102 and the drift region 100.

Said fluorine concentration can also be greater than $10^{16}$ atoms*cm$^{-3}$, e.g., greater than $5*10^{17}$ atoms*cm$^{-3}$ or even greater than $10^{19}$ atoms*cm$^{-3}$.

For example, the anode region 102 extends into the semiconductor body 10 along the vertical direction Z for at least 2 μm, for at least 4 μm or for at least 6 μm.

Further, in an embodiment, a distance between a peak of the electric field during a blocking state of the power diode 1 and the lower termination 10221 of the anode damage zone 1022 may amount to at least 250 nm, to at least 400 nm or to at least 600 nm. Such distance between the peak $E_{MAX}$ of the electric field E during a blocking state of the power diode 1 and the lower termination 10221 is exemplarily illustrated in FIGS. 3 and 4 and referenced as $\Delta Z$. For example, the power diode 1 can be configured, e.g., by means of said distance $\Delta Z$, such that a space charge region, e.g., during a blocking state of the power diode 1, does not extend into the damage zone 1022.

Figure 3:
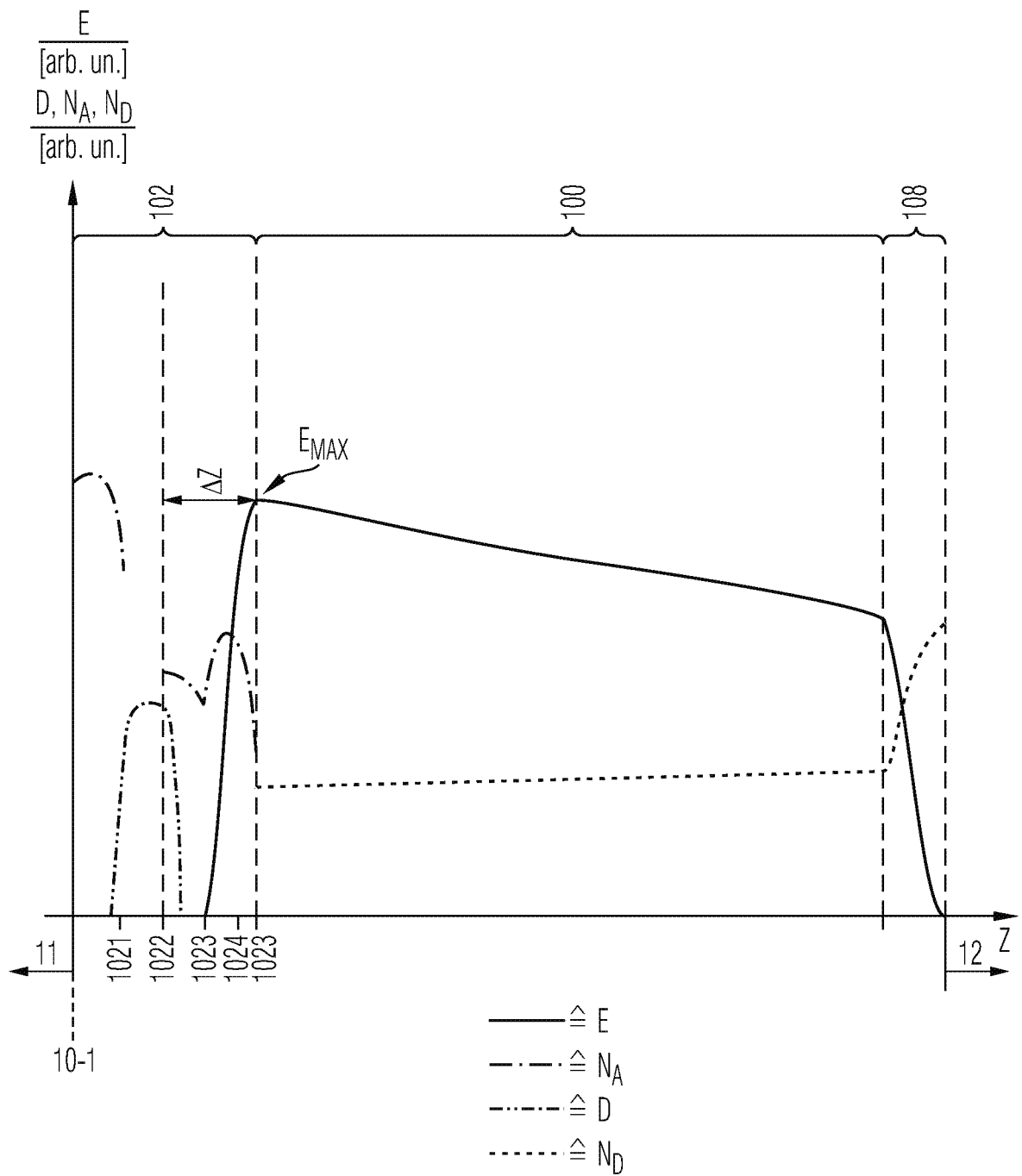
FIG. 3 schematically and exemplarily illustrates a course of an electric field and courses of charge carrier concentrations present in a semiconductor body of a power diode in accordance with one or more embodiments.

Now referring to FIG. 3 in more detail, exemplary extensions and dopant concentration $N_A$ (p-type dopants), $N_D$ (n-type dopants) and defect (D) concentrations shall be explained. It shall be understood that these exemplarily values may apply to all embodiments described above regarding both the method and the power diode 1. FIG. 4 illustrates a section of the courses of dopant concentrations $N_A$ and $N_D$ and the defect concentration D as well as the course of the electric field E of FIG. 3 in an enlarged view.

The anode contact zone 1021, which may be arranged in contact with the anode metallization 11, and which may exhibit an upper termination that may form a part of the surface 10-1, may be p-doped at a high concentration of approximately $10^{19}$ cm$^{-3}$. Further, a fluorine concentration of at least $10^{16}$ atoms*cm$^{-3}$ may be present in the anode contact zone 1021. The anode contact zone 1021 may have a total extension in the vertical direction Z of approximately 50 nm up to 200 nm.

The anode damage zone 1022, which may be arranged below and in contact with the anode contact zone 1021, may exhibit a high defect concentration of approximately $10^{19}$ cm$^{-3}$. Further, a fluorine concentration of at least $10^{16}$ atoms*cm$^{-3}$ may be present in the anode damage zone 1022. The anode damage zone 1022 may have a total extension in the vertical direction Z of approximately 100 nm up to 400 nm.

As has been explained above, the anode contact zone 1021 and the anode damage zone 1022 may be formed by a single ion implantation processing step and a subsequent temperature annealing processing step during which the defects caused by the ion implantation are only partially annealed.

The anode body zone(s) 1023 arranged below the anode damage zone 1022 may be p-doped at a base concentration of approximately $10^{17}$ cm$^{-3}$. The anode body zone(s) 1023 may have a total extension in the vertical direction Z of approximately 200 nm up to 700 nm. As has been explained above, the anode region 102 may include the anode field stop zone 1024, either as a zone that terminates the anode region 102 in the vertical direction Z or as a zone arranged between two anode body zones 1023 as illustrated in FIG. 3. The anode field stop zone 1024 may be p-doped at a higher concentration than the anode body zone(s) 1023, e.g., with a concentration of approximately $10^{18}$ cm$^{-3}$. The anode field stop zone 1024 may have a total extension in the vertical direction Z of approximately 200 nm up to 600 nm.

The drift region 100 may be n-doped at a low dopant or an intrinsic concentration, e.g., with a concentration of up to $5*10^{14}$ cm$^{-3}$. For example, the dopant concentration of the drift region 100 and its total extension along the vertical direction Z are chosen in dependence on the voltage rating for which the power diode 1 shall be designed.

The drift region 100 can be coupled to the cathode metallization 12 by means of the cathode contact region 108. For example, the cathode contact region 108 is arranged in contact with the cathode metallization 12 and may be n-doped at a dopant concentration of approximately $1*10^{20}$ cm$^{-3}$. For example, the cathode contact region 108 has a total extension along the vertical direction Z of up to 0.3 μm.

Embodiments described above include the recognition that a power diode with an anode that only weakly emits holes can be achieved with an anode that has a highly doped contact zone and a damage zone. However, under circumstances, e.g., a high operating temperatures, such damage zone may also act as a charge carrier generation zone. For avoiding such effect, it can be ensured that the space charge region does not extend into the damage zone. In accordance with one or more embodiment described above, it is proposed to provide for a very narrow anode damage zone that is sufficiently far spatially displaced from the space charge region, without having the need of providing a deep reaching anode region. For example, such damage zone can be formed by means of a single BF$_2$ implantation that is followed by a temperature annealing processing step during which the BF$_2$ defects are only partially annealed, so as to simultaneously produce the anode damage zone and the anode contact zone on top thereof that is to interface with the anode metallization. In accordance with an embodiment, for forming the anode damage zone and the contact zone, not boron but BF$_2$ is implanted.

In the above, embodiments pertaining to power diodes and corresponding processing methods were explained. For example, these power diodes are based on silicon (Si). Accordingly, a monocrystalline semiconductor region or layer, e.g., the semiconductor body 10 and its regions/zones, e.g., regions 100, 102, 108 etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a power diode. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power diode, comprising:
   a semiconductor body having an anode region and a drift region, the semiconductor body being coupled to an anode metallization of the power diode and to a cathode metallization of the power diode; and
   an anode contact zone and an anode damage zone, both implemented in the anode region, the anode contact zone being arranged in contact with the anode metallization, and the anode damage zone being arranged in contact with and below the anode contact zone,
   wherein fluorine is included within each of the anode contact zone and the anode damage zone at a fluorine concentration of at least 1016 atoms*cm-3.

2. The power diode of claim 1, wherein a distance between a peak of the electric field during a blocking state of the power diode and a lower termination of the anode damage zone is at least 250 nm.

3. The power diode of claim 1, wherein a space charge region does not extend into the anode damage zone.

4. The power diode of claim 1, wherein the semiconductor body further comprises a cathode contact region, wherein the drift region is coupled to the cathode metallization by means of the cathode contact region.

5. The power diode of claim 1, wherein the anode region further comprises an anode body zone disposed below the anode damage zone.

6. The power diode of claim 5, wherein the anode body zone has a total extension in the vertical direction of between 200 nm and 700 nm.

7. The power diode of claim 6, wherein the anode region further comprises an anode field stop zone, wherein the anode field stop zone forms a termination of the anode region, or wherein the anode field stop zone is disposed between two of the anode body zones.

8. The power diode of claim 7, wherein the anode field stop zone is spaced apart from the anode damage zone by at least 250 nm in the vertical direction.

9. The power diode of claim 8, wherein a distance between a peak electric field during a blocking state of the power diode and a lower termination of the anode damage zone is at least 250 nm.

10. The power diode of claim 1, wherein the anode contact zone extends to a surface of the semiconductor body, wherein the anode damage zone is immediately beneath the anode contact zone, wherein the anode damage zone has a comparatively higher defect concentration and a comparatively lower dopant concentration than the anode contact zone.

11. The power diode of claim 1, further comprising an anode field stop zone within the anode region, the anode field stop zone being arranged deeper within the anode region than each of the anode contact zone and the anode damage zone.

12. The power diode of claim 1, wherein the anode damage zone extends into the anode region along a vertical direction no further than down to an extension level of 75 nm, measured from a surface of the semiconductor body.

13. The power diode of claim 1, wherein the anode region extends into the semiconductor body along the vertical direction for at least 2 µm.

* * * * *